United States Patent [19]

Higashi et al.

[11] Patent Number: 4,890,076
[45] Date of Patent: Dec. 26, 1989

[54] REFLECTION TYPE SSB MODULATOR

[75] Inventors: Kazutada Higashi, Tenri; Masamori Tokuda, Mie; Hiroshi Nakano, Tenri; Tomozo Ohta, Ikoma, all of Japan

[73] Assignee: Sharp Kabushiki Kaisha, Osaka, Japan

[21] Appl. No.: 183,983

[22] Filed: Apr. 20, 1988

[30] Foreign Application Priority Data

Apr. 20, 1987 [JP] Japan ................................. 62-98367

[51] Int. Cl.[4] .......................... H03C 1/12; H03C 1/14; H03C 1/60
[52] U.S. Cl. ..................................... 332/170; 332/175; 455/109
[58] Field of Search ............... 332/45, 52, 56; 455/47, 455/109

[56] References Cited

U.S. PATENT DOCUMENTS 3,573,660  4/1971  Garver et al. .......................... 332/45
3,739,301  6/1973  Garver ................................ 332/45 X

Primary Examiner—Siegfried H. Grimm
Attorney, Agent, or Firm—Birch, Stewart, Kolasch & Birch

[57] ABSTRACT

The SSB modulator according to the present invention is comprised of a driving voltage generator, a diode, a bias supply circuit, an impedance transformation circuit and an input/output terminal. The SSB modulator is arranged such that the impedance of the diode is changed by changing the driving voltage impressed across the diode, resulting in the mismatching of the impedance, which leads to generation of a reflected wave. Therefore, by changing the amplitude and the phase of the above-obtained reflected wave, SSB modulation is effected. Accordingly, the SSB modulator of the present invention, requiring no particular side band filter, is compact in size, light in weight and low in manufacturing cost, with a simple structure of the circuit.

14 Claims, 5 Drawing Sheets

(a) circuit diagram (b) waveform at point Ⓐ

(c) waveform at point Ⓑ

Fig.2

(a) circuit diagram (b) waveform at point Ⓐ

(c) waveform at point Ⓑ

(a) impedance orbit of diode and impedance orbit after transformation (b)

(a) circuit diagram (b) voltage waveform at point Ⓔ

(c) voltage waveform at point Ⓕ

(d) voltage waveform at point Ⓖ

Fig. 6
(a) construction

(b) spectrum at point C (c) spectrum at point D

Fig. 7    PRIOR ART

REFLECTION TYPE SSB MODULATOR

BACKGROUND OF THE INVENTION

1. Field of the Invention

The present invention generally relates to an SSB modulator used in the microwave region.

2. Description of the Prior Art

A variety of identification methods for detecting and identifying a moving object have been developed in recent years since such identification systems were put into practical use. The system referred to above is used to detect whether or not a moving object such as an automobile vehicle or freight car is present in a certain supervisory zone. It also identifies the object if such a moving object is observed. According to the identification system, when a microwave which is not modulated (the frequency is, for example, 2.45 GHz) is radiated from an interrogator to a transponder, it is received and modulated by the transponder on the basis of information stored in the transponder. Then, the modulated microwave is radiated again to the interrogator which in turn demodulates the modulated microwave, thereby obtaining information about the moving object. Thus, the presence or absence of the moving object, and the kind of the moving object, are detected in the identification system. Since the wave sent and received by the interrogator in the above-described identification system has the same frequency, the circuit construction can be simplified if the transponder employs an SSB modulation system and the interrogator employs the homodyne wave-detection method.

Figure 6:
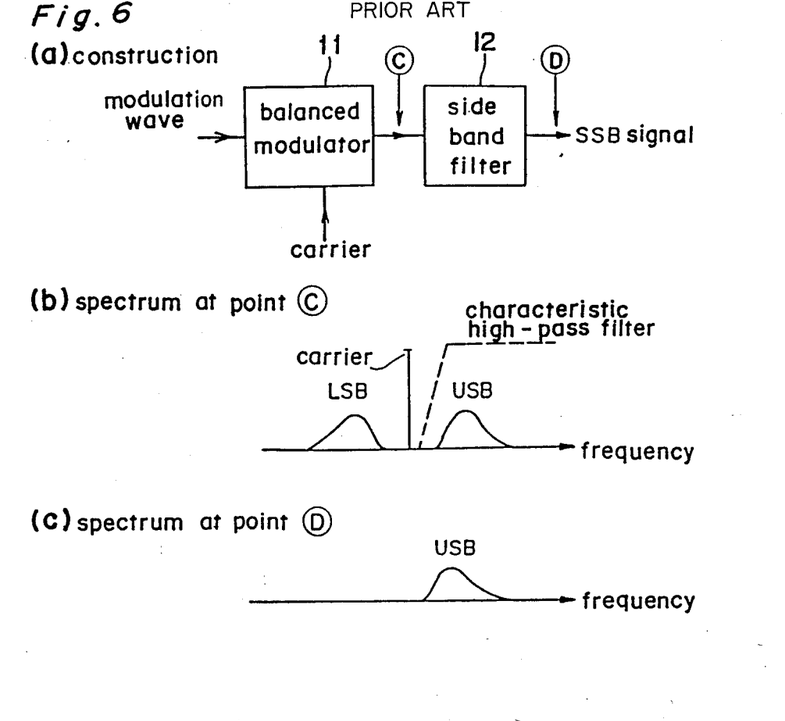
FIGS. 6(a), 6(b) and 6(c) are diagrams explanatory of a conventional SSB modulator employing a Selective-Filtering Method.
Figure 7:
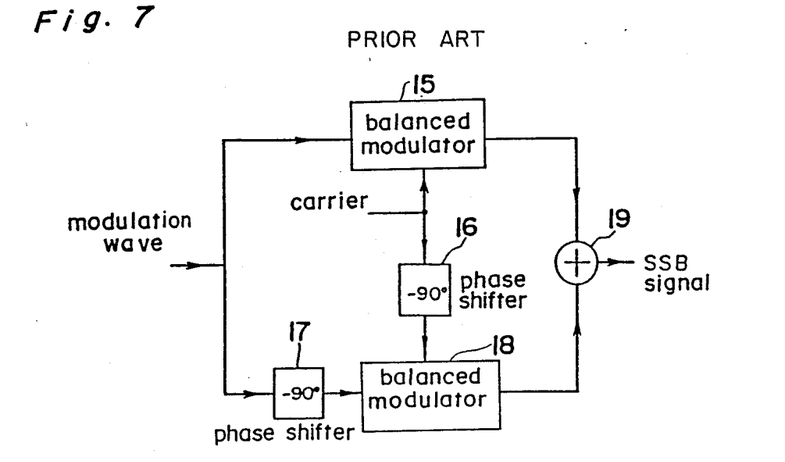
FIG. 7 is a block diagram of a conventional SSB modulator employing a Phase-Shift Method.

Conventional methods for SSB modulation are illustrated in FIGS. 6 and 7. In the method of FIG. 6, the Selective-Filtering Method, the carrier wave and the modulation wave are multiplied in a balanced modulator 11. Then, only the necessary side band is extracted by a side band filter 12 from outputs of the balanced modulator 11. A high-pass filter or a low-pass filter is used for the side band filter 12, which is required to have a considerably sharp cut-off characteristic. On the other hand, the method shown in FIG. 7 is called a Phase-Shift Method, according to which the modulation wave and the carrier wave are respectively divided into two. One each of the modulation wave and the carrier wave, after division, are multiplied in a balanced modulator 15, while the others of the modulation wave and the carrier wave are respectively delayed 90° in phase by phase shifters 16 and 17, and then mixed in a balanced modulator 18. Thereafter, output signals from the balanced modulators 15 and 18 are added in an adder 19, to obtain an SSB signal.

However, according to the above-described SSB modulator employing the Selective-Filtering Method, since only the necessary side band is extracted from the resulted modulated wave by the side band filter 12, the SSB modulator is hard to use in the microwave region because the side band frequency is only 20K–200 KHz away from the carrier wave frequency of 2.45 GHz. In other words, since the USB (upper side band) is close to LSB (lower side band), the side band filter 12 should have a steep cut-off characteristic. However, the microwave band filter is formed in many cases in the pattern of a copper foil on a printed board, for which the board itself has a low Q (quality factor) of 100, and accordingly, the above-described side band filtering with filter 12 is difficult to achieve.

Meanwhile, according to the SSB modulator based on the Phase-Shift Method, every frequency in the modulated wave should be shifted 90° phase difference by the phase shifter 17. However, such a phase shifter is difficult to realize, and therefore, the SSB modulator employing the Phase-Shift Method can only be used approximately in a limited frequency region. Moreover, since the circuit construction of the SSB modulator using the Phase-Shift Method is complicated, the above SSB modulator is hard to employ as a modulator for detection of a moving object which requires it to be compact in size and light in weight.

SUMMARY OF THE INVENTION

Accordingly, an essential object of the present invention is to provide an SSB modulator which is designed to be inexpensive in manufacturing cost, compact in size and light in weight, with simplified circuit construction, without requiring a particular side band filter.

In accomplishing the above-described object, according to the present invention, the SSB modulator is comprised of: a driving voltage generator for generating a driving voltage; a diode, the barrier capacitance of which varies depending on the voltage impressed across the diode; a bias supply circuit for supplying the driving voltage produced by the driving voltage generator to the diode; an impedance transformation circuit having a two-terminal pair network possessed with linear-mapping characteristics between a load impedance connected to one pair of terminals; and an impedance seen from the other pair of terminals, and an input/output terminal connected to the diode through the impedance transformation circuit, wherein a radio frequency power (i.e., RF power), applied to the input/output terminal, is modulated to provide an SSB modulated output from the input/output terminal.

In the SSB modulator of the present invention having the above-described construction, when the driving voltage is generated by the driving voltage generator and impressed across the diode through the bias supply circuit, the barrier capacitance of the diode is changed in accordance with a change of the impressed driving voltage. This results in a change of the impedance of the diode in accordance with the change of the impressed driving voltage. On the other hand, when an RF power source is applied to the input/output terminal, a reflected wave is produced by the mismatching of the impedance. In this case, if the output impedance of the RF power is selected to be at a given value, the reflected wave can be regarded as a single side band wave, which is formed of a carrier wave both the magnitude and the argument of which are proportional to a fixed vector, and a side band wave proportional to a vector having constant dimensions and rotating to draw a circle on the complex plane on the basis of the change of the impedance of the diode. Therefore, the SSB modulator of the present invention is arranged so that the amplitude and the phase of the reflected wave are changed in accordance with changes in the impedance of the diode caused by changes in the driving voltage, to thereby create SSB modulation.

BRIEF DESCRIPTION OF THE DRAWINGS

These and other objects and features of the present invention will become clear from the following description taken in conjunction with the preferred embodiments thereof with reference to the accompanying drawings, in which:

FIG. 1 is a block diagram showing the structure of an SSB modulator according to the present invention;

DETAILED DESCRIPTION OF THE INVENTION

Before the description of the present invention proceeds, it is to be noted that like parts are designated by like reference numerals throughout the accompanying drawings.

Referring to a block diagram of FIG. 1, the SSB modulator of the present invention includes an input/output terminal 1, an impedance transformation circuit 2, a diode 3, a bias supply circuit 4 and a driving voltage generator 5.

FIG. 2(a) is a circuit diagram of the SSB modulator according to the first embodiment of the present invention, with reference to which the operation of the SSB modulator will be described hereinbelow.

The driving voltage generator 5 generates a voltage which periodically decreases in monotone. Namely, the waveform of the voltage is shown with a kind of sawtooth waveform wherein each sawtooth is formed so as to decrease in the voltage from a certain high position to a given low position without increasing at any positions therebetween. An integrated circuit IC1 is comprised of general-purpose timer ICs, and produces a square wave having the frequency determined by resistors R1 and R2, and a capacitor C1. FIG. 2(b) shows the waveform of an output of the above IC1 at the point Ⓐ. It is so arranged that the cycle of the waveform is determined to be T1<<T2 by the values of the resistors R1 and R2. A transistor Q1 becomes electrically conductive during the period T1 in FIG. 2(b) to let a capacitor C2 discharge, and electrically non-conductive during the period T2 subsequent to the period T1, so that the capacitor C2 is charged through a resistor R4. Accordingly, the charging time constant of the capacitor C2 is R4·C2. The voltage at the opposite ends of the resistor R4, namely, at the point Ⓑ, is monotonously decreased with the inclination $\exp\{-t/R4\cdot C2\}$ (t is a variable expressing time). Namely, the waveform of the voltage is shown by a kind of sawtooth waveform wherein each of sawtooth is formed so as to decrease in voltage from a certain high position to a given low position without increasing at any positions therebetween. The bias supply circuit 4 is comprised of band stop filters. The bias supply circuit 4 supplies the driving voltage generated by the driving voltage generator 5 to the diode 3, and prevents the RF power supplied to the opposite ends of the diode 3, through the input/output terminal 1, from leaking to the side of the driving voltage generator 5. The diode 3, which changes its barrier capacitance depending on the voltage supplied thereto, is formed, for example, by a varactor, a Schottky barrier diode, etc. According to the present embodiment, a Schottky barrier diode is employed for the diode 3. The impedance transformation circuit 2 is composed of an inductance $L_S$ using a strip line and an open stub $C_P$ in the instant embodiment. After the RF power applied to the input/output terminal 1 undergoes SSB modulation, it is taken out of the input/output terminal 1 again. The SSB modulated signal can be separated from the input signal by inserting a circulator into the input/output terminal 1. Further, if an antenna is connected to the input/output terminal 1, the RF power can be received by the antenna, and the modulated wave can be discharged from the antenna again.

The characteristic feature of the present invention is such that the impedance of the diode 3 is changed in accordance with the change of the driving voltage impressed across the diode 3. This causes mismatching of the impedance leading to the generation of the reflected wave. Accordingly, the modulation is carried out by controlling the amplitude and the phase of the reflected wave generated in the above-described manner.

The operation for modulation will be described hereinbelow.

Figure 3:
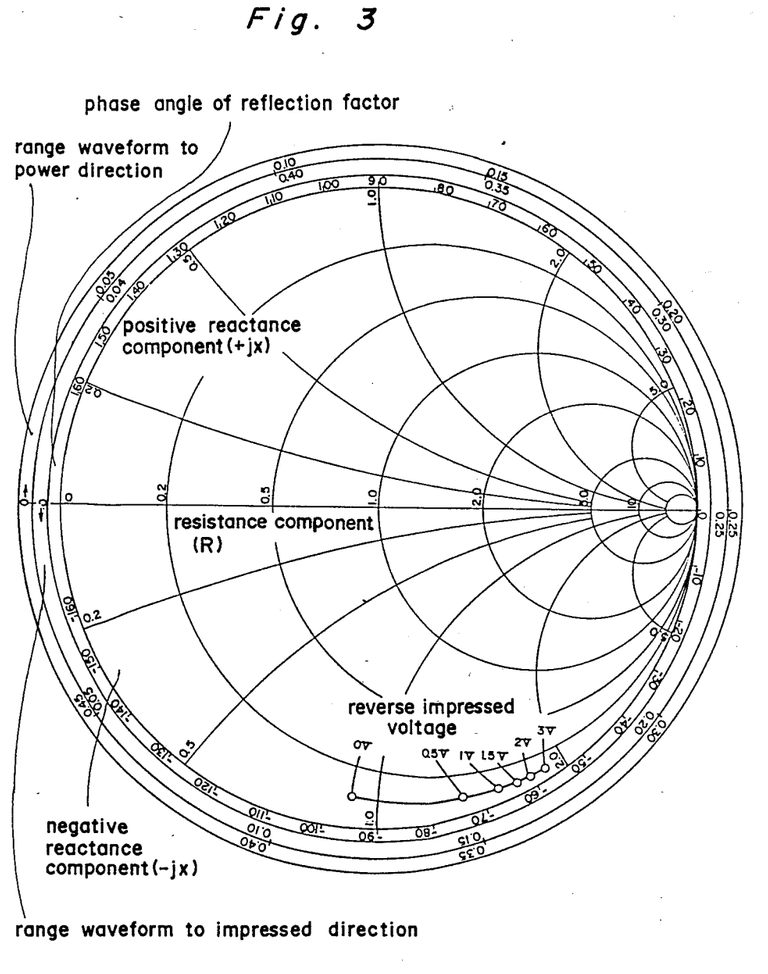
FIG. 3 is a diagram showing the impedance characteristic of a driving voltage impressed across a diode.
Figure 4:
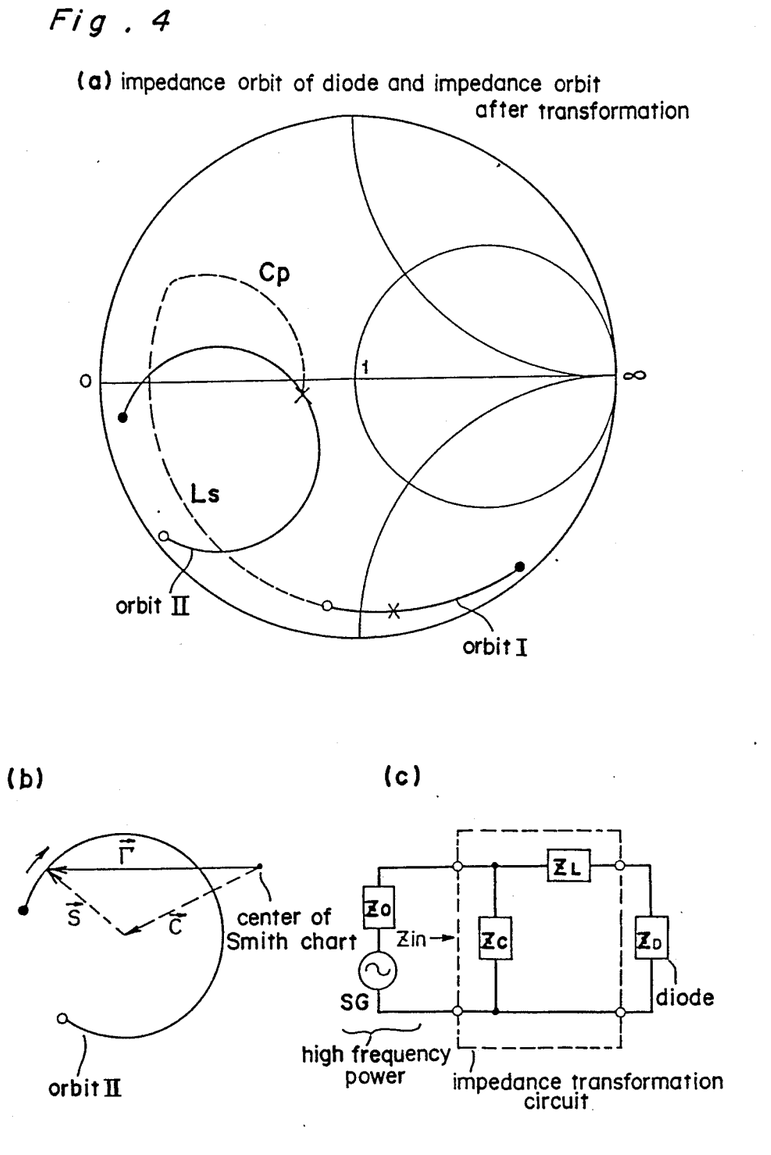
FIGS. 4(a), 4(b) and 4(c) are diagrams explanatory of the operation of the SSB modulator of FIG. 2.

While the reverse voltage impressed across the diode 3 is changed from 0 V to 3 V, only the impedance of the diode 3 is measured, and is plotted on the Smith chart in FIG. 3 (the measuring frequency is 2.45 GHz). As seen from FIG. 3, although the resistance component of the impedance of the diode 3 is almost constant, the reactance component varies in accordance with the voltage supplied to the diode 3. That is, the impedance of the diode 3 changes along the circumference of a constant resistance circle on the Smith chart. FIG. 4(a) is an orbit (orbit I) of the change of the impedance of the diode 3 illustrated on a simplified Smith chart. Moreover, an orbit II of FIG. 4(a) is an orbit obtained after transformation of the impedance from the orbit I. In other words, the orbit II is an impedance orbit of the impedance transformation circuit 2 seen from the input/output terminal 1. The marks ⊙ and ● in the orbits I and II show the impedances respectively, when the impressed voltage is 0 V and 3 V. Further, the mark x on the orbit I represents the impedance with respect to any optional impressed voltage from 0 V to 3 V. Moreover, a broken line shows how the impedance with the mark x on the orbit I is transformed into the impedance marked with an x on the orbit II by the inductance $L_S$ and the open stub $C_P$ of the impedance transformation circuit 2.

The circuit of the SSB modulator in the first embodiment can be expressed by an equivalent circuit shown in FIG. 4(c). It is to be noted here that reference characters ZL, ZC and ZD respectively represent the inductance $L_S$, the open stub $C_P$ and the impedance of the diode 3. The RF power source SG and its output impedance Zo are connected to the input/output terminal 1 for explanation of the operation of the modulator. In the equivalent circuit of FIG. 4(c), the impedance of the impedance transformation circuit 2 seen from the input/output terminal 1, namely, Zin in FIG. 4(c), is expressed by the following equation.

$$Zin = \frac{ZC \cdot ZD + ZL \cdot ZC}{ZD + ZL + ZC} \quad (1)$$

In the above equation (1), supposing that $a = ZC$, $b = ZL \cdot ZC$, $c = 1$ and $d = ZL + ZC$, Zin can be represented as follows.

$$Zin = \frac{aZD + b}{cZD + d} \quad (2)$$

Generally, the two-terminal pair network, without including a power source, can be expressed by equation (2). It is known according to the theory of complex functions that, when all of the values a, b, c and d are constant, and $ad - bc \neq 0$ is established in equation (2), the relation of Zin and ZD displays a linear mapping characteristic, such that Zin draws a circle on the complex plane if ZD draws a circle on the complex plane. In equation (1), since both ZL and ZC are definite if the frequency is fixed, all of the values a, b, c and d become constant. Moreover, $ad - bc = ZC \cdot (ZL + ZC) - ZL \cdot ZC = ZC^2 \neq 0$ is established, and accordingly, Zin can be regarded as the linear function of ZD in equation (1). Therefore, Zin also makes a circle if ZD draws a circle on the complex plane. As has been described earlier, since it is clear that ZD forms a part of the constant resistance circle on the Smith chart, therefore, Zin is also a part of the circle. In other words, the orbit II makes a part of a circle, not a closed circle.

Referring to FIG. 4(c), when the RF power source SG is connected to the modulator of the present embodiment for inputting of the RF power, the mismatching of the impedance gives rise to a reflected wave. In this case, the reflection factor $\Gamma$ is expressed as follows.

$$\Gamma = \frac{Zin - Zo}{Zin + Zo} \quad (3)$$

If the amplitude and phase angle of input wave is fixed, the amplitude of the reflected wave is proportional to the absolute value of the reflection factor $|\Gamma|$, with the phase difference from the incident wave being expressed as an argument of the reflection factor $\Gamma$. Accordingly, if the output impedance Zo of the RF power source SG is selected to be equal to the normalized impedance of the Smith chart, the reflection factor $\Gamma$ is expressed by a vector $\vec{\Gamma}$ as shown in FIG. 4(b), starting from the center of the Smith chart and finishing at a point on the orbit II. More specifically, the phase angle of the reflected wave is equal to the argument of the vector $\vec{\Gamma}$, and the amplitude of the reflected wave is proportional to that of the vector $\vec{\Gamma}$. When the driving voltage shown in FIG. 2(c) is supplied to the diode 3, the terminus of the vector $\vec{\Gamma}$ moves, as shown in FIG. 4(b), on the orbit II in a clockwise direction. In other words, when the driving voltage is 3 V, the terminus of the vector $\vec{\Gamma}$ is positioned on the mark ●, while, when the driving voltage becomes 0 V, the terminus of the vector $\vec{\Gamma}$ reaches the mark ○. The terminus moves in the clockwise direction on the orbit II in accordance with the decrease of the driving voltage supplied to the diode 3. In the case where the driving voltage has a periodical waveform, the terminus of the vector $\vec{\Gamma}$ repeatedly moves on the orbit II in the clockwise direction. At this time, since the orbit II is known to make a part of a circle as described earlier, the vector $\vec{\Gamma}$ can be broken into a vector $\vec{C}$ having fixed magnitude and argument which starts from the center of the Smith chart and ends at the center of a circle including the orbit II, and a vector $\vec{S}$ having a fixed size which rotates to draw a circle, starting from the center of a circle including the orbit II and terminating at a point on the orbit II.

As a result, the reflected wave is able to be regarded as a single side band wave composed of a carrier wave proportional to the vector $\vec{C}$ and a side band wave proportional to the vector $\vec{S}$. Therefore, it can be said that the modulator according to the first embodiment of the present invention operates as an SSB modulator of a reflection type.

Although the driving voltage is designed to be smoothly reduced in periodic succession in the foregoing first embodiment with such waveforms as shown in FIGS. 2(b) and 2(c), it is not necessarily so designed according to the present invention, but can be reduced stepwise as in the second embodiment shown in FIGS. 5(a)–5(d). Referring to a circuit diagram of the second embodiment shown in FIG. 5(a), the modulator including the input/output terminal 1, the impedance transformation circuit 2, the diode 3, and the bias supply circuit 4 is of the same construction as the modulator of the first embodiment, except that a driving voltage generator 5 produces voltage having a stepwise waveform. More specifically, if the resistance value of the resistors R1 and R2, for giving weight coefficients of a 2-bit digital-analog converter, is properly determined by an output signal generated from a square wave oscillator 6 (FIG. 5(b)), and an output signal is obtained by dividing the above output signal in half by a ½ frequency divider 7 (FIG. 5(c)), such a driving voltage having a stepwise waveform as shown in FIG. 5(d) can be obtained. In the case whereby the above-described driving voltage having the stepwise waveform is supplied to the diode 3, the terminus of the vector $\vec{S}$ in FIG. 4(b) does not trace on the orbit II continuously in accordance with the change of the voltage impressed to the diode 3, but rotates in a scattered manner to pass only four points on the orbit II. As a result of this, the same SSB modulated signal as obtained in the first embodiment can be achieved.

Figure 2:
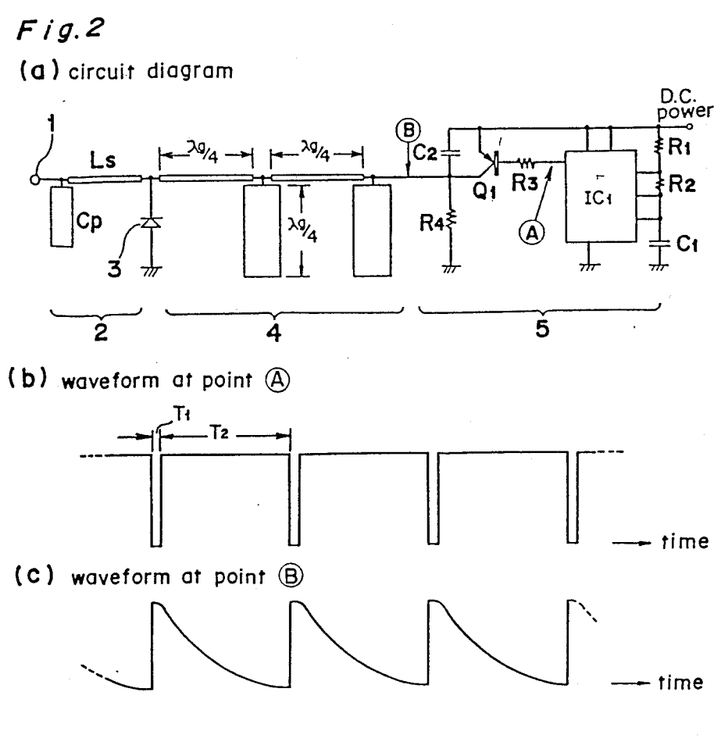
FIGS. 2(a), 2(b) and 2(c) are, respectively, a circuit diagram and waveforms of the driving voltage at points A and B according to a first embodiment of the present invention.
Figure 5:
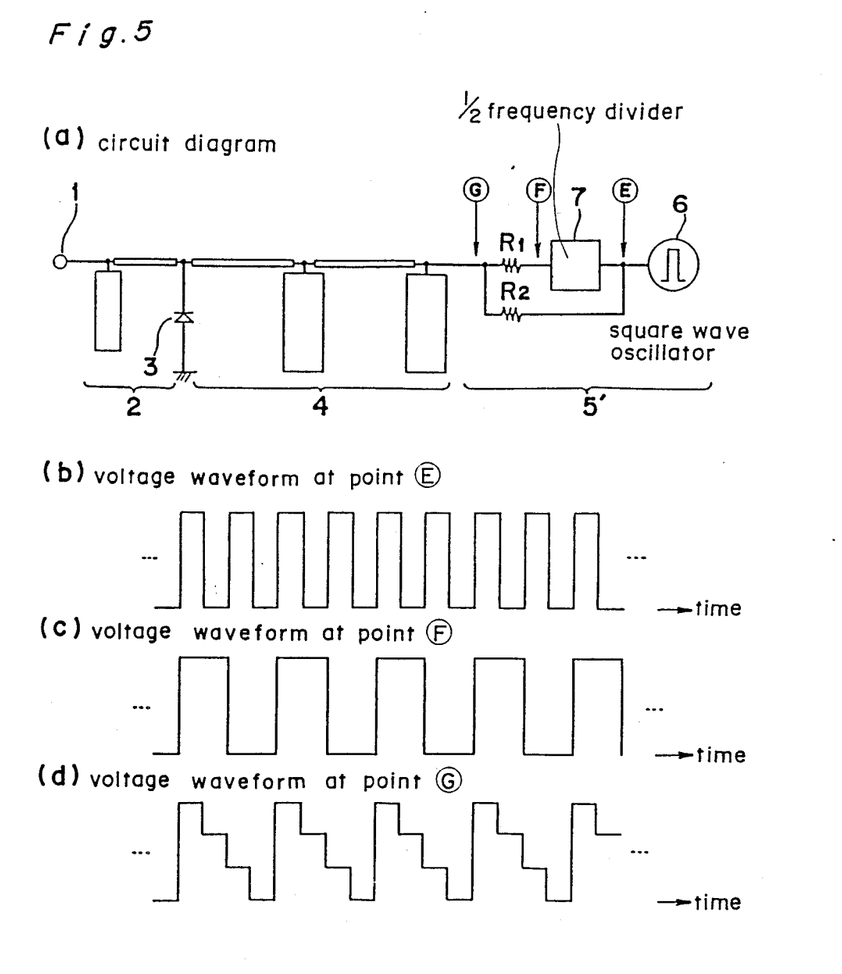
FIGS. 5(a), 5(b), 5(c) and 5(d) are, respectively, a circuit diagram and waveforms of the driving voltage at points E, F and G according to a second embodiment of the present invention.

In actual modulation, the so-called double modulation is employed. That is, the driving voltage is modulated with ASK (amplitude-shift-keying) or FSK (frequency-shift-keying) or similar techniques, by the transmitted binary data, and then the carrier wave is subjected to SSB modulation. The frequency of the driving voltage which corresponds to that of a sub-carrier wave is set to be approximately 20K–200 KHz. In the case of the first embodiment shown in FIG. 2, if the direct current power supply of the integrated circuit IC1 is intermittently cut, i.e., the power source voltage is turned ON/OFF by the transmitted two value data, the oscillation of the IC1 is switched ON/OFF, thereby to effect ASK modulation. On the other hand, FSK modulation can be realized when both the time constant determined by R4 and C2 and the time constant determined by R1, R2 and C1 are simultaneously changed by the transmitted two value data. Meanwhile, in the case of the second embodiment shown in FIG. 5, if the oscillation of the square wave oscillator 6 is switched ON/OFF by the transmitted two value data, ASK modulation can be effected. Moreover if the frequency of the square wave oscillator 6 is changed by the transmitted two value data, FSK modulation can be realized.

Accordingly, as has been described hereinabove, in the SSB modulator of the present invention, there are provided the driving voltage generator, the diode, the bias supply circuit, the impedance transformation circuit and the input/output terminal, so that the driving voltage supplied to the diode is changed to change the impedance of the diode. Consequent to the change of the impedance of the diode, the mismatching of the impedance is brought about, resulting in generation of the reflected wave. By changing the amplitude and the phase of the reflected wave, SSB modulation is carried out in the SSB modulator of the present invention. Therefore, the SSB modulator of the present invention is compact in size, light in weight, and manufactured at low cost with remarkably simple circuit construction.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An SSB modulator for modulating radio frequency power, comprising:
   driving voltage generation means for generating a driving voltage;
   bias supply means for supplying said driving voltage to a variable impedance means;
   variable impedance means for varying a load impedance, said variable impedance means varying its impedance in accordance with a varying of the driving voltage supplied thereto;
   impedance transformation means responsive to said variable impedance means, for transforming an input impedance into a variable impedance dependant upon said variable load impedance, said impedance transformation means comprising a two-terminal pair network having linear mapping characteristics between said variable load impedance connected to one of said pair of terminals and said input impedance as seen from the other pair of terminals; and
   input/output means connected to said variable impedance means through said impedance transformation means,
   said radio frequency power applied to said input/output means being modulated to provide an SSB modulated output from said input/output means.

2. An SSB modulator as claimed in claim 1, wherein said variable impedance means is a Schottky diode.

3. An SSB modulator as claimed in claim 2, wherein said varying of said variable impedance means in accordance with a varying of the driving voltage supplied thereto, is a varying of a barrier capacitance of said diode in accordance with a varying of the driving voltage supplied thereto.

4. An SSB modulator as claimed in claim 1, wherein said SSB modulated output is that of a reflected wave.

5. An SSB modulator as claimed in claim 4, wherein the radio frequency power source comprises an output impedance.

6. An SSB modulator as claimed in claim 5, wherein a mismatching of said output impedance and said input impedance gives rise to the modulated output reflected wave.

7. An impedance transformation system in an SSB modulator for modulating radio frequency power, comprising:
   driving voltage generation means for generating a driving voltage;
   bias supply means for supplying said driving voltage to a variable impedance means;
   variable impedance means for varying a load impedance, said variable impedance means varying its impedance in accordance with a varying of the driving voltage supplied thereto; and
   impedance transformation means responsive to said variable impedance means, for transforming an input impedance into a variable impedance dependent upon said variable load impedance, said impedance transformation means comprising a two-terminal pair network having linear mapping characteristics between said variable load impedance connected to one of said pair of terminals and said input impedance as seen from the other pair of terminals.

8. An impedance transformation system as claimed in claim 7, wherein said variable impedance means is a Schottky diode.

9. An impedance transformation system as claimed in claim 8, wherein said varying of said variable impedance means in accordance with a varying of the driving voltage supplied thereto, is a varying of a barrier capacitance of said diode in accordance with a varying of the driving voltage supplied thereto.

10. A method of SSB modulation comprising the steps of:
    a. generating a driving voltage;
    b. supplying said driving voltage to a load impedance;
    c. varying said load impedance in accordance with a varying of said driving voltage;
    d. transforming an input impedance into a variable impedance dependent upon said variable load impedance by means of a two-terminal pair network having linear mapping characteristics between said variable load impedance connected to one of said pair of terminals and said input impedance as seen from the other pair of terminals;
    e. applying radio frequency power to input/output means connected to the two-terminal pair network;
    f. modulating said applied radio frequency power; and
    g. outputting an SSB modulated output through said input/output means.

11. A method of SSB modulation comprising the steps of:
    a. generating a driving voltage;
    b. supplying said driving voltage to a Schottky diode;
    c. varying a barrier capacitance of the Schottky diode in accordance with a varying of said driving voltage;
    d. varying a load impedance by means of the varying barrier capacitance of the diode;
    e. connecting an input/output means to said diode through an impedance transformation means;
    f. transforming an input impedance of said impedance transformation means into a variable impedance dependent upon said variable load impedance by means of a two-terminal pair network having linear mapping characteristics between said variable load impedance connected to one of said pair of terminals and said input impedance as seen from the other pair of terminals;
    (g) applying a radio frequency power to said input/output means connected to said two-terminal pair network;

(h) modulating said applied radio frequency power; and (i) outputting an SSB modulated output through said input/output means.

12. A method as claimed in claim 10 or 11 wherein said SSB modulated output is that of a reflected wave.

13. A method as claimed in claim 12, wherein the radio frequency power source, which is applied to said input/output means, comprises an output impedance.

14. A method as claimed in claim 13, wherein a mismatching of said output impedance and said input impedance gives rise to the modulated output reflected wave.

* * * * *